(12) United States Patent
Hartmann et al.

(10) Patent No.: US 9,882,159 B2
(45) Date of Patent: Jan. 30, 2018

(54) VOLTAGE-LIGHT CONVERSION DEVICE

(71) Applicant: OLEDWORKS GMBH, Aachen (DE)

(72) Inventors: Soren Hartmann, Baesweiler (DE); Meik Rekittke, Aachen (DE); Pieter Gijsbertus Maria Kruijt, Eindhoven (NL)

(73) Assignee: OLEDWORKS GMBH, Aachen (DE)

( * ) Notice: Subject to any disclaimer, the term of this patent is extended or adjusted under 35 U.S.C. 154(b) by 0 days.

(21) Appl. No.: 15/027,023

(22) PCT Filed: Sep. 25, 2014

(86) PCT No.: PCT/EP2014/070452
§ 371 (c)(1),
(2) Date: Apr. 4, 2016

(87) PCT Pub. No.: WO2015/049151
PCT Pub. Date: Apr. 9, 2015

(65) Prior Publication Data
US 2016/0254478 A1  Sep. 1, 2016

(30) Foreign Application Priority Data
Oct. 3, 2013  (EP) ..................................... 13187225

(51) Int. Cl.
*H01L 25/04* (2014.01)
*H01L 51/52* (2006.01)
(Continued)

(52) U.S. Cl.
CPC ...... *H01L 51/5209* (2013.01); *H01L 51/0023* (2013.01); *H01L 51/0096* (2013.01);
(Continued)

(58) Field of Classification Search
CPC .................... H01L 21/02436; H01L 23/3735
See application file for complete search history.

(56) References Cited

U.S. PATENT DOCUMENTS

| 8,507,899 B2 | 8/2013 | Tanase et al. | |
| 2002/0140347 A1* | 10/2002 | Weaver | H01L 25/047 313/506 |
| 2015/0014672 A1* | 1/2015 | Yamae | H05B 33/04 257/40 |

FOREIGN PATENT DOCUMENTS

| CN | 102144310 B | 8/2013 |
| WO | 2013064941 A1 | 5/2013 |

(Continued)

*Primary Examiner* — Olik Chaudhuri
*Assistant Examiner* — Lamont Koo

(57) ABSTRACT

The invention relates to a voltage-light conversion device (1) like an OLED comprising a structured electrically conducting layer (3) on a substrate (2) and a further layer (60) that is part of an encapsulation and which comprises a layer edge (63). The electrically conducting layer comprises in an edge region (70) close to the layer edge a structure edge (10), wherein at least a part of the structure edge is not perpendicular to the layer edge. Since in the edge region at least a part of the structure edge is not perpendicular to the layer edge, during the production process for producing the further layer a possible flow of initially liquid layer material along the structure edge can be directed such that the liquid material remains relatively close to the desired layer edge, i.e. the liquid material can be better locally confined.

10 Claims, 10 Drawing Sheets

(51) Int. Cl.
*H01L 51/00* (2006.01)
*H01L 51/56* (2006.01)

(52) U.S. Cl.
CPC ...... *H01L 51/5203* (2013.01); *H01L 51/5225* (2013.01); *H01L 51/5253* (2013.01); *H01L 51/56* (2013.01); *H01L 2251/308* (2013.01); *H01L 2251/5361* (2013.01)

(56) References Cited

FOREIGN PATENT DOCUMENTS

WO           2013114295 A1    8/2013
WO    WO 2013118508 A1 *   8/2013  ............. H05B 33/04

* cited by examiner

VOLTAGE-LIGHT CONVERSION DEVICE

FIELD OF THE INVENTION

The invention relates to a voltage-light conversion device like an organic light-emitting device (OLED) or an organic photovoltaic device (OPVD). The invention relates further to a substrate of the voltage-light conversion device.

BACKGROUND OF THE INVENTION

An OLED generally comprises a structured ITO layer on a glass substrate, wherein the ITO layer forms a first electrode and wherein the OLED further comprises a second electrode and organic light-emitting material arranged between the first and second electrodes. Moreover, the OLED can comprise a thin-film encapsulation formed by a stack of different layers for sealing at least the organic light-emitting material, wherein the stack of the thin-film encapsulation may include an inorganic layer, for instance, a SiN layer, and a polymer layer and wherein during the manufacturing process of the OLED the inorganic layer may be applied in a chemical vapor deposition (CVD) process and the polymer layer may be locally applied onto the inorganic layer in a wet chemical process like inkjet printing. During the wet chemical process the polymer layer may not remain locally confined within an edge region, in which an edge of the polymer layer should be formed, i.e. it may undesirably spread out.

SUMMARY OF THE INVENTION

It is an object of the present invention to provide a voltage-light conversion device, which can be manufactured such that a layer, which is made of material which is liquid during a manufacturing process for manufacturing the voltage-light conversion device, can be better locally confined within an edge region, in which an edge of the layer should be formed. It is a further object of the present invention to provide a substrate of the voltage-light conversion device, a manufacturing apparatus and method for manufacturing the voltage-light conversion device and a manufacturing apparatus and method for manufacturing the substrate.

In a first aspect of the present invention a voltage-light conversion device is presented, wherein the voltage-light conversion device comprises a first electrode, a second electrode, a voltage-light conversion material adapted to perform a voltage-light conversion and arranged between the first electrode and the second electrode, and an encapsulation for encapsulating at least the voltage-light conversion material, wherein the encapsulation comprises a further layer having a layer edge, the further layer being made of a material that is liquid during a process for manufacturing the voltage-light conversion device. The voltage-light conversion device further comprises a structured electrically conducting layer on a substrate, wherein at least one of the first and second electrodes is formed by or electrically connected to the structured electrically conducting layer. The structured electrically conducting layer comprises a structure edge in an edge region, wherein the edge region also comprises the layer edge of the further layer that is comprised in the encapsulation. In the edge region at least a part of the structure edge of the structured electrically conducting layer is not perpendicular to the layer edge of the further layer that is comprised in the encapsulation.

It has been found that the difficulties with the local confinement of a liquid material, which is used for producing a layer having a layer edge, within an edge region, in which the layer edge should be formed, are caused by a flow of the liquid material along a straight structure edge being entirely straight and perpendicular to the layer edge. If in the edge region at least a part of the structure edge is not perpendicular to the layer edge, the flow of the liquid material along the structure edge can be redirected such that the liquid material remains closer to the desired layer edge. In this way the liquid material can be better locally confined within the edge region.

The entire structure edge or only a part of the structure edge may be not perpendicular to the layer edge in the edge region. In an embodiment the edge region can be defined as having a border, which is not covered by the layer and which is parallel to the layer edge, wherein the distance between this border and the layer edge is preferentially equal to or smaller than 4 mm, further preferred equal to or smaller than 3 mm and even further preferred equal to or smaller than 2 mm. The part of the structure edge, which is not perpendicular to the layer edge, is preferentially at least partly located between the layer edge and the parallel border of the edge region.

At the location of the structure edge the substantially regular layer edge may be still slightly disturbed by unwanted solidified layer material, which may have been flown along the structure edge during the manufacturing process, although this adverse effect is strongly reduced by the shape of the structure edge. It should be noted that, if this is the case, the term "not perpendicular to the layer edge" should refer to the regular layer edge and not to the slight disturbance of the layer edge at the location of the structure edge.

The voltage-light conversion material can be adapted to convert voltage into light or to convert light into voltage. In the first case the voltage-light conversion device can be, for instance, an OLED and in the second case the voltage-light conversion device can be, for example, an OPVD. The structured electrically conducting layer is preferentially an indium tin oxide (ITO) layer on the substrate being preferentially a glass substrate.

Preferentially in the edge region the structure edge comprises a first part being not perpendicular to the layer edge and an adjacent second part enclosing an angle with the first part within a range of 45 to 135 degrees. The first part of the structure edge is preferentially closer to the layer edge than the second part. The angle enclosed by the first and second parts is, for instance, 90 degrees. Such a structure edge very effectively confines the liquid material for forming the layer within the edge region during the manufacturing process.

Preferentially the structure edge is a meander-type edge such that at least a part of the structure edge is not perpendicular to the layer edge, i.e. preferentially a meander-type edge is used as the structure edge which comprises at least a part which is not perpendicular to the layer edge. It is preferred that the meander-type edge comprises at least one 90 degrees location at which adjacent portions of the edge enclose an angle of 90 degrees. The edge may comprise several 90 degrees locations, in order to form the meander type. Thus, the edge may comprise 90 degrees corners or 90 degrees curves, which very effectively redirect the flow of the liquid such that it is better confined within the edge region. However, the meander-type edge can also be shaped in another way. For instance, the meander-type edge can be formed by semicircular parts.

The encapsulation is preferentially a thin-film encapsulation comprising several layers. It preferentially comprises a polymer layer and an inorganic layer. In particular, it can comprise a polymer layer in between two inorganic layers, which might be $Al_2O_3$, $Si_xO_y$, $Si_xN_y$, $TiO_2$, $ZrO_2$, et cetera layers, wherein the layer edge may be formed by the polymer layer. However, it may also be formed by another layer, for instance, by another polymer layer and/or a layer of the voltage-light conversion material. The voltage-light conversion material preferentially includes organic voltage-light conversion material. It may comprise a stack of different layers. For instance, if the voltage-light conversion device is an OLED, the voltage-light conversion material may comprise several emitting layers, which may emit different colors, and optionally further layers for providing electrons and holes in appropriate energy levels, i.e. in energy levels required for generating the light.

The structured electrically conducting layer is preferentially structured by a groove comprising the structure edge. The width of the groove may vary along the run of the groove. In particular, the groove may comprise wider portions having a larger width and narrower portions having a smaller width. A sequence of narrower portions may be arranged between two wider portions, wherein the narrower portions may comprise the meander-type edge. The wider portions may have a width of 3 mm and the narrower portions may have a width of 0.25 mm. The groove may comprise an alternating sequence of three narrower parallel portions being parallel to the layer edge and two narrower perpendicular portions being perpendicular to the layer edge.

In a second aspect of the present invention a substrate for manufacturing the voltage-light conversion device according to the first aspect is presented, wherein the substrate comprises a structured electrically conducting layer and wherein the structure edge is a meander-type edge.

It shall be understood that the voltage-light conversion device according to the first aspect and the substrate according to the second aspect have similar and/or identical preferred embodiments, in particular, as defined in the dependent claims.

It shall be understood that a preferred embodiment of the invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
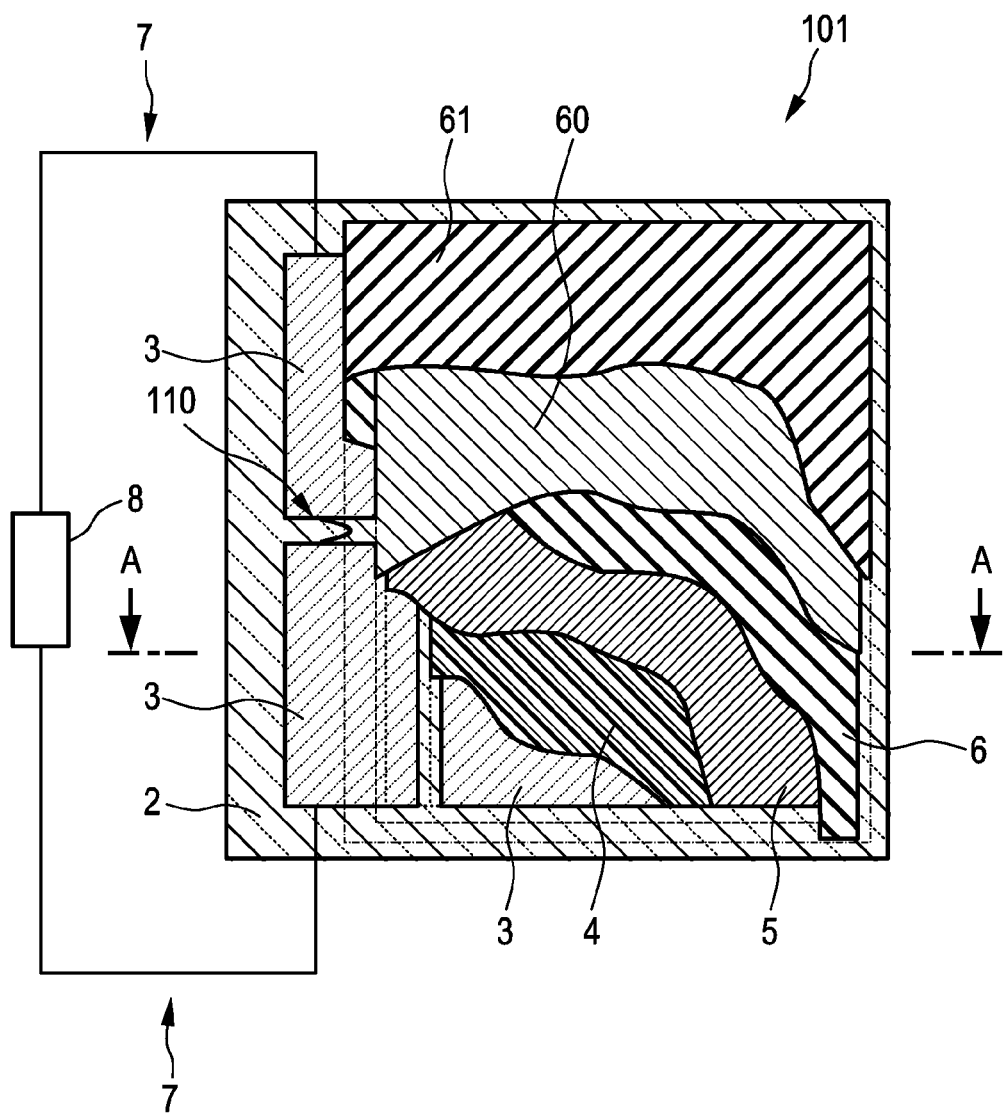
FIG. 1 shows schematically and exemplarily an OLED.
Figure 2:
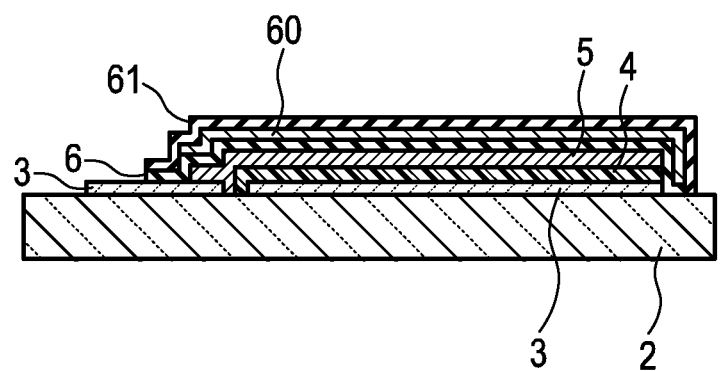
FIG. 2 shows schematically and exemplarily a sectional view of the OLED shown in FIG. 1.

FIG. 1 shows schematically and exemplarily an embodiment of an OLED. FIG. 2 shows schematically and exemplarily a sectional view of this OLED along a line indicated by A-A. The OLED 101 comprises a substrate 2 with a structured electrically conducting layer 3 being preferentially an ITO layer.

The electrically conducting layer 3 forms a first electrode. The OLED 1 further comprises a second electrode 5, which may be a metal electrode, wherein organic light-emitting material 4 is arranged between the first and second electrodes 3, 5. A voltage source 8 is connected to the first and second electrodes 3, 5 via electrical connections 7, wherein the organic light-emitting material 4 is adapted to emit light, if voltage is applied to the first and second electrodes 3, 5.

The OLED 1 further comprises a thin-film encapsulation for encapsulating at least the organic light-emitting material 4, in order to protect the organic light-emitting material 4 against moisture and other environmental influences. The thin-film encapsulation is formed by a stack of different layers 6, 60, 61. In this embodiment the thin-film encapsulation is formed by a first barrier layer 6, an interlayer 60 and a second barrier layer 7. The first and second barrier layers 6, 61 may be inorganic layers. The interlayer 60 may be a polymer layer. It may be adapted to protect the second electrode 5, which may be regarded as being a cathode layer, and the inorganic layer 6. The interlayer 60 may be a water repulsive layer to avoid water ingress into the organic light-emitting material 4. It may be a water scavenging layer. The interlayer 60 may be further adapted to provide a scratch protection, to provide a light incoupling function and/or to provide a light outcoupling function.

Figure 3:
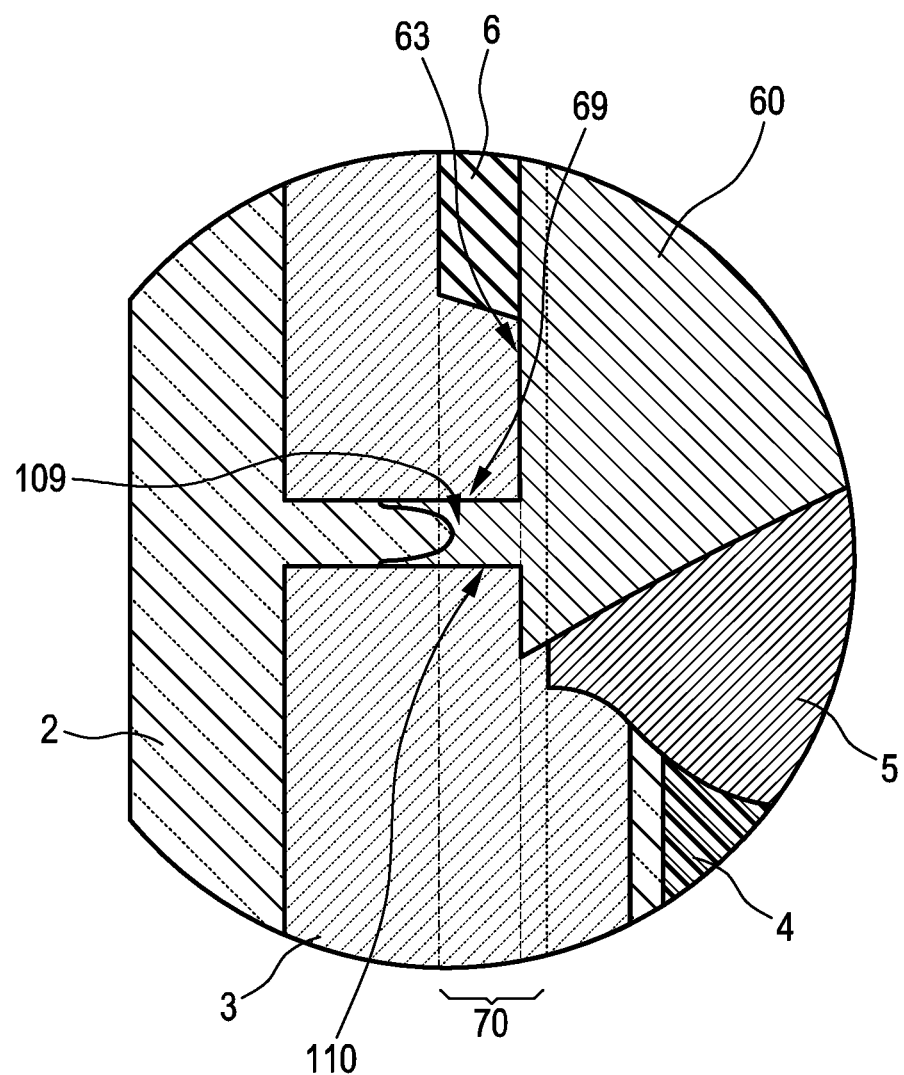
FIG. 3 shows schematically and exemplarily a part of the OLED.

FIG. 3 shows schematically and exemplarily a part of the OLED shown in FIGS. 1 and 2. As can be seen in FIG. 3, within an edge region 70, which comprises a layer edge 63 of the interlayer 60, a straight groove 109 with straight structure edges 110, which are perpendicular to the layer edge 63, is formed. During the manufacturing process for manufacturing the OLED 101 liquid interlayer material has been used, in order to produce the interlayer 60, wherein the liquid interlayer material flowed along the straight structure edges 110 in a direction pointing a way from the layer edge 63. This results in an undesired outflow component 69 at the layer edge 63 of the interlayer 60.

Figure 4:
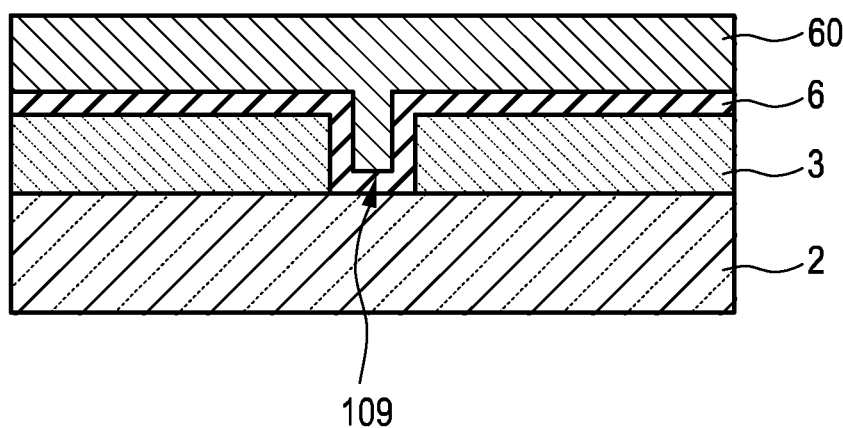
FIG. 4 shows schematically and exemplarily a sectional view of the part of the OLED shown in FIG. 3.

FIG. 4 shows schematically and exemplarily a sectional view of the substrate 2 with the structured electrically conducting layer 3 comprising the groove 109, after the first barrier layer 6 and the interlayer 60 have been applied. As illustrated in FIG. 4, the first barrier layer 6 follows the contours of the groove 109 very well. Thus, if the interlayer 60 is applied onto the first barrier layer 6, the structure of the ITO layer 3 is still visible and leads to the unwanted outflow.

Figure 5:
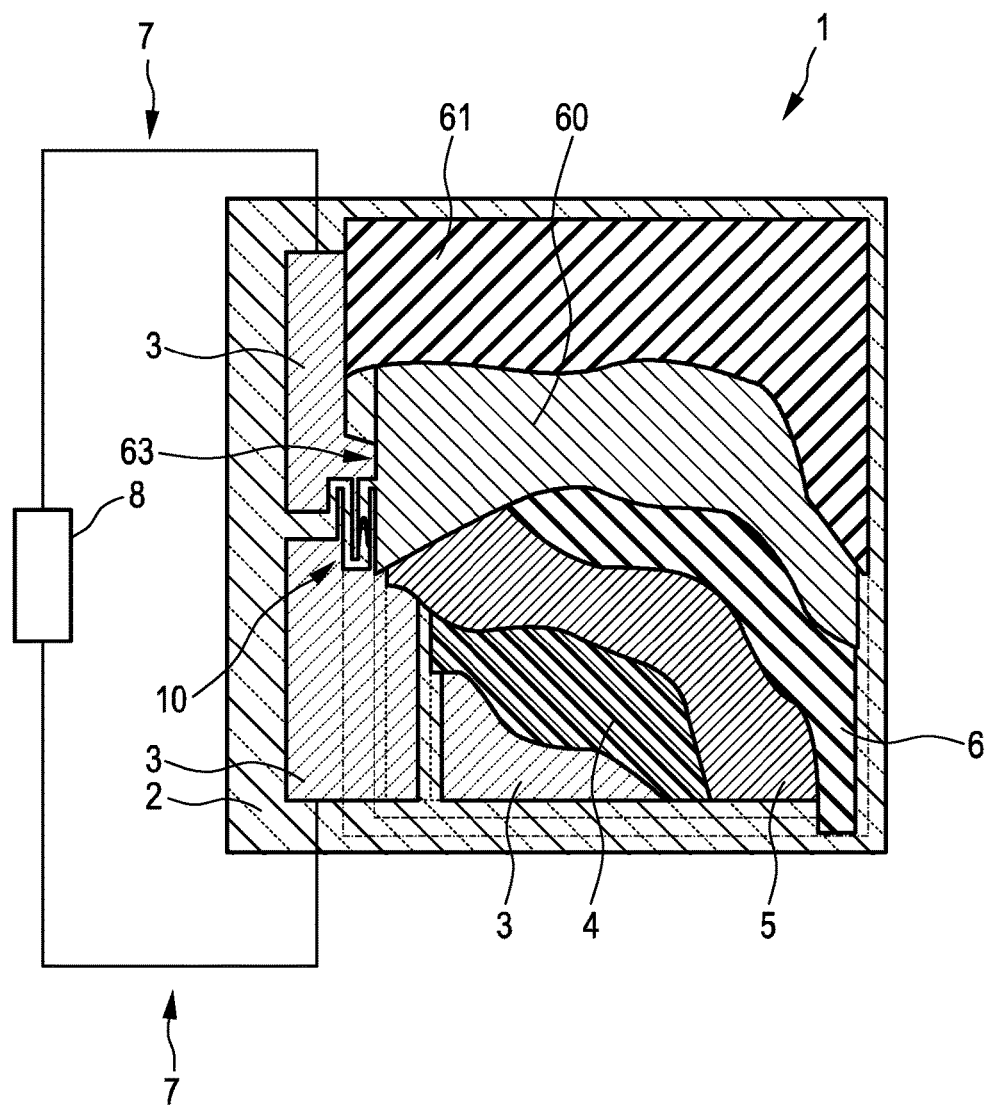
FIG. 5 shows schematically and exemplarily an embodiment of an OLED in accordance with the invention.
Figure 6:
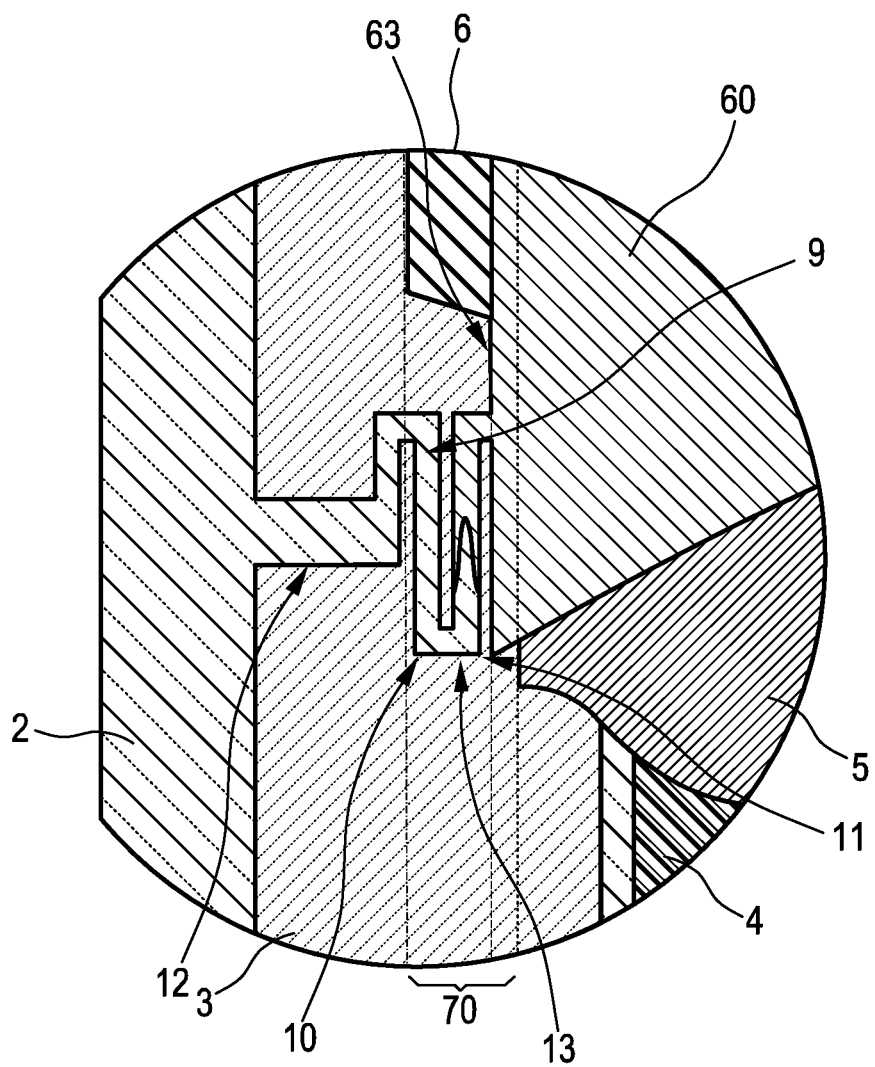
FIG. 6 shows schematically and exemplarily a part of the embodiment shown in FIG. 5.

For this reason an OLED in accordance with the present invention comprises a structure edge having a part in the edge region 70 being not perpendicular to the layer edge 63 of the interlayer as schematically and exemplarily shown in FIGS. 5 and 6.

The embodiment 1 of the OLED in accordance with the invention as schematically and exemplarily shown in FIGS. 5 and 6 also comprises a substrate 2 with a structured electrically conducting material 3, organic light-emitting material 4, the second electrode 5 and the encapsulation 6, 60, 61. However, in the embodiment 1 in accordance with the invention the structure of the electrically conducting layer 3 comprises a meander-type edge 10 in the edge region 70 where the layer edge 63 of the interlayer 60 is arranged. In this edge region the encapsulation reaches to the structured electrically conducting layer 3.

The meander-type edge 10 comprises at least one 90 degrees location 11 at which a perpendicular portion of the edge 10, which is perpendicular to the encapsulation rim, and a parallel portion of the edge 10, which is parallel to the encapsulation rim, enclose an angle of 90 degrees. The edge 10 comprises several 90 degrees locations 11, in order to form the meander-type. The edge 10 is an edge of a groove 9, wherein in this embodiment the width of the groove 9 varies along the run of the groove 9. In particular, the groove 9 comprises a wider portion 12 having a larger width and narrower portions 13 having a smaller width.

Figure 7:
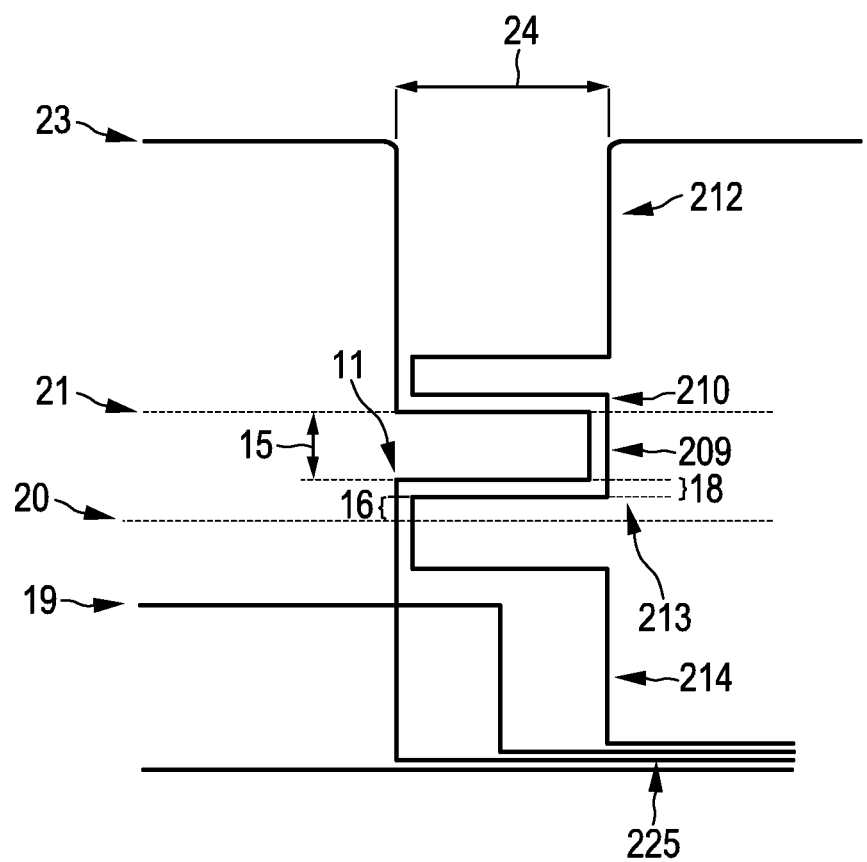
FIG. 7 shows schematically and exemplarily a part of another embodiment of an OLED in accordance with the invention, FIG. 8 schematically and exemplarily shows a manufacturing apparatus for manufacturing an OLED.

FIG. 7 schematically and exemplarily illustrates a further embodiment of a meander-type structure formed by an edge 23 of an electrically conducting material. In this embodiment the meander-type structure comprises a sequence of narrower portions 213 of a groove 209 between two wider portions 212, 214 of the groove 209, wherein the sequence of narrower portions 213 comprises a meander-type edge 210. Moreover, the wider portion 214 is arranged between the sequence of narrower portions 213 and a further narrower portion 225. The wider portions 212, 214 may have a width 24 of 3 mm and the narrower portions 213 may have a width 18 of 0.25 mm. The distance 15 between two narrower parallel portions of the groove in between the wider portions 212, 214 may be 1 mm. Moreover, the distance 16 between an edge 20 of an interlayer 60 and the nearest narrower parallel portion may be 0.3 mm. In other embodiments the meander-type structure can comprise other dimensions. FIG. 7 further shows an edge 19 of a cathode layer 5 and an edge 21 of a barrier layer 6, 60.

Figure 8:
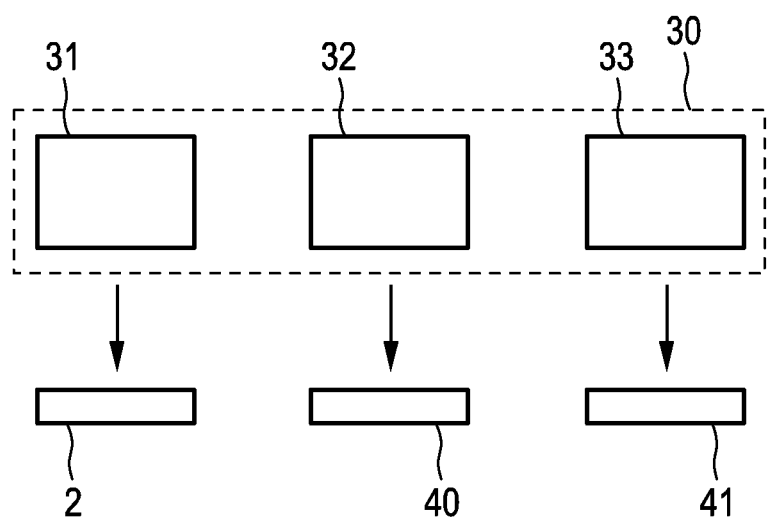

FIG. 8 shows schematically and exemplarily a manufacturing apparatus for manufacturing the OLED 1. The manufacturing apparatus 30 comprises a substrate providing unit 31 for providing a substrate 2 with a structured electrically conducting layer, wherein the structured electrically conducting layer comprises a meander-type edge. In this embodiment the substrate providing unit 31 is adapted to provide a structured ITO layer on the substrate 2, wherein the structured ITO layer comprises the groove with the meander-type edge. In FIG. 8 the resulting substrate with the structured electrically conducting layer is indicated by reference number 40. The substrate providing unit 31 may be adapted to apply a subtractive technique to a completely ITO coated substrate, which may be a glass or polymer substrate, in order to generate the structure in the ITO layer. The subtractive technique might be, for instance, laser ablation, edge paste printing, photolithography, et cetera. In another embodiment the substrate providing unit 31 may be adapted to create the substrate with the structured electrically conducting layer by applying the electrically conducting layer on the substrate in a structured way, for instance, by sputtering electrically conductive material through a shadow mask, by printing such as gravure printing, flexo printing, inkjet printing, screen printing, et cetera.

The manufacturing apparatus 30 further comprises a voltage-light conversion material and electrode providing unit 32 for arranging organic light-emitting material between first and second electrodes, wherein the first electrode is formed by the structured electrically conducting layer. In this embodiment the voltage-light conversion material and electrode providing unit 32 is adapted to deposit the organic light-emitting material and metallic material for forming the second electrode on the structured electrically conducting layer, in order to provide a structure in which the organic light-emitting material is arranged between the first and second electrodes. The resulting substrate with the structured electrically conducting layer, the organic light-emitting material and the second electrode is indicated by reference number 41. The voltage-light conversion material and electrode providing unit 32 may be adapted to, for instance, deposit the organic light-emitting material by vacuum deposition and to deposit the second electrode, which preferentially forms a cathode, by vacuum sputtering. However, the organic light-emitting material and the metallic material forming the second electrode can also be deposited by using other techniques.

The manufacturing apparatus further comprises an encapsulation providing unit 33 for providing the thin-film encapsulation. In particular, the encapsulation providing unit 33 is adapted to provide the different layers of the thin-film encapsulation. For instance, an inorganic layer can be applied by a CVD process or an atomic layer deposition (ALD) process and a polymer layer may be locally applied onto the inorganic layer in a wet chemical process like inkjet printing. The CVD process generates an inorganic layer following the contours of the structured electrically conducting layer. Since the polymer layer may be applied by using a wet chemical process like inkjet printing, the corresponding applied liquid material may flow along a straight edge of the structured electrically conducting layer into undesired regions on the substrate. However, due to the meander-type edge of the structure of the electrically conducting layer this flow of the liquid material is redirected such that it is better confined to the edge region, in which the desired edge of the polymer layer should finally be present. Since the encapsulation providing unit 33 provides the polymer layer finally forming the layer edge in the edge region, the encapsulation providing unit 33 can be regarded as being a layer providing unit for providing a layer of the OLED such that the layer edge is formed in the edge region.

The encapsulation providing unit 33 can be adapted to provide the inorganic layer by CVD, physical vapor deposition (PVD), ALD et cetera, and the polymer layer by coating or printing like gravure printing, flexo printing, inkjet printing, silk screen printing, et cetera. The encapsulation providing unit 33 can be adapted to perform the sequence of chemical vapor deposition and coating or printing several times, in order to form an encapsulation made of several layers.

By better locally confining the liquid material during the manufacturing process, the quality of applying the liquid material, in particular, the spatial accuracy of applying the liquid material, can be improved and the application of further layers on top of the layer formed by the liquid material can be simplified.

The manufacturing apparatus 30 can comprise further units for providing the OLED with further components like further layers, electrical wires for providing the electrical connection to a voltage source, et cetera. The substrate providing unit 31 can be regarded as being a processing apparatus for providing a structured electrically conducting layer on the substrate such that the structured electrically conducting layer comprises a meander-type edge.

Figure 9:
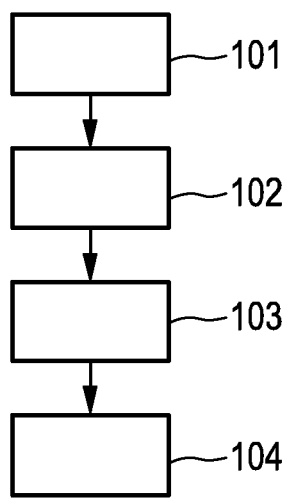
FIG. 9 shows a flowchart exemplarily illustrating an embodiment of a manufacturing method for manufacturing an OLED.

In the following an embodiment of a manufacturing method for manufacturing the OLED will exemplarily be described with reference to a flowchart shown in FIG. 9.

In step 101 a substrate with a structured electrically conducting layer is provided, wherein the structured electrically conducting layer comprises the meander-type edge. In particular, an ITO layer may be provided on a glass substrate such that the ITO layer comprises the meander-type edge. In step 102 organic light-emitting material and metallic material are applied to the structured electrically conducting layer, in order to generate a structure comprising the organic light-emitting material between the structured electrically conducting layer forming a first electrode and a second electrode formed by the applied metallic material. In step 103 a thin-film encapsulation is provided such that it encapsulates at least the organic light-emitting material. In step 104 the first and second electrodes are provided with electrical connections, in order to connect these electrodes with a voltage source.

Step 101 can be regarded as being a step of a processing method for processing a substrate such that a structured electrically conducting layer comprising a meander-type edge is provided on the substrate. The steps of the manufacturing method can be performed by the manufacturing apparatus described above with reference to FIG. 8, particularly automatically, or they can at least partly be performed manually.

The groove in the structured electrically conducting material may be used as an electrodes separation, in particular, as an anode-cathode separation, wherein the first electrode may be formed by a first part of the structured electrically conducting layer and a second part may be used to electrically connect the second electrode to the voltage source.

The outflow of the liquid material may be caused by capillary forces, wherein this outflow can be minimized by the meander structure of the groove and correspondingly of the edge of the groove.

The meander-type edge of the structure of the electrically conducting layer is especially helpful when a polymer layer of the thin-film encapsulation is applied. If in an embodiment the OLED comprises an ITO/inorganic/polymer/inorganic structure, the meander-type edge is preferentially arranged in an edge region comprising this structure, in order to reduce a possible outflow of the polymer materials during the manufacturing process at the desired encapsulation rim. If no meander structures would be used, the outflow would be wider, i.e. wider rims would have to be used.

The substrate preferentially comprises ITO areas with a meander-type edge, instead of ITO areas with a straight edge, wherein the meander-type edge may have a curve of about 90 degrees. Having an ITO layer with such meander-type edge strongly confines the area in which outflow of a liquid material like a polymer layer may occur. The structured electrically conducting material can comprise one or several meander-type edges and corresponding grooves. In particular, on the substrate several edge areas can be present, wherein each edge area can comprise one or several meander-type edges.

Although in above described embodiments the substrate with the structured electrically conducting layer comprising a meander-type edge is used for manufacturing an OLED, in another embodiment the substrate with the structured electrically conducting layer comprising the meander-type edge can also be used to manufacture another voltage-light conversion device like an OPVD.

Although in above described embodiments the meander-type edge leads to a reduced outflow of liquid encapsulation materials, in other embodiments the meander-type edge can also reduce the flow of other liquid materials, in particular, of other liquid polymer materials like polymer hole-injection layer material.

Although in above described embodiments the layer edges, which are located in the respective edge region, in which the structure edge is present, are substantially straight, in other embodiments the layer edge can also have another shape, for instance, it can be curved.

Although in above described embodiments the electrically conducting layer comprises a certain structure with a certain structure edge, in other embodiments the electrically conducting layer can comprise another structure having another structure edge.

Figure 10:
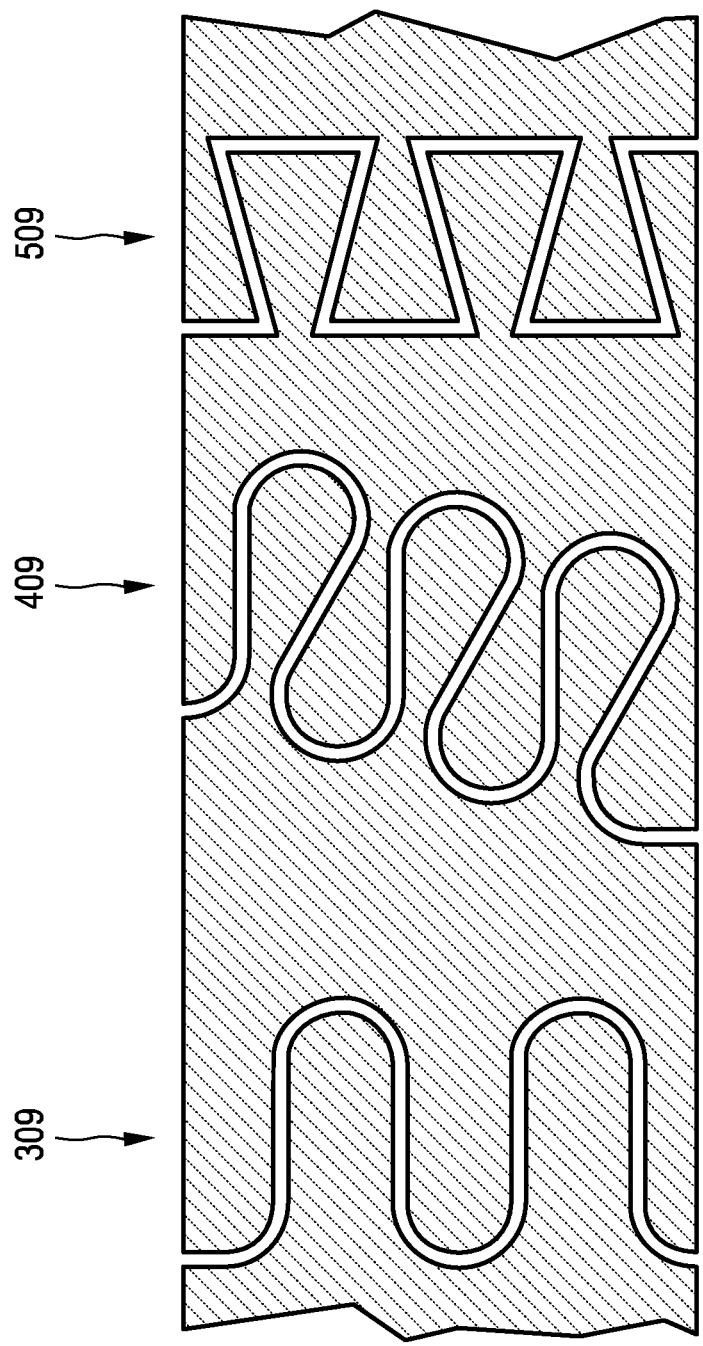
FIG. 10 shows schematically and exemplarily different meander-type edges.

For instance, the electrically conducting layer can have one or several of the meander-type structures 309, 409, 509 schematically and exemplarily shown in FIG. 10. The structure edge can also be an L-type edge.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Procedures like the provision of the structured electrically conducting layer on the substrate, the provision of the voltage-light conversion material, the provision of electrodes, the provision of an encapsulation, et cetera performed by one or several units or devices can also be performed by any other number of units or devices. For example, steps 101 to 104 can be performed by a single unit or by any other number of different units. These procedures and/or the control of the manufacturing apparatus for manufacturing the voltage-light conversion device in accordance with the manufacturing method for manufacturing the voltage-light conversion device and/or the control of the processing apparatus for processing a substrate in accordance with the processing method for processing the substrate can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a voltage-light conversion device like an OLED comprising a structured electrically conducting layer on a substrate and a further layer, which may be a layer of an encapsulation and which comprises a layer edge. The electrically conducting layer comprises in an edge region close to the layer edge a structure edge, wherein at least a part of the structure edge is not perpendicular to the layer edge. Since in the edge region at least a part of the structure edge is not perpendicular to the layer edge, during the production process for producing the further layer a possible flow of initially liquid layer material along the structure edge can be directed such that the liquid material remains relatively close to the desired layer edge, i.e. the liquid material can be better locally confined.

The invention claimed is:

1. A voltage-light conversion device comprising:
   a first electrode on top of a substrate,
   a second electrode,
   a voltage-light conversion material adapted to perform a voltage-light conversion and arranged between the first electrode and the second electrode,
   a thin-film encapsulation for encapsulating at least the voltage-light conversion material, the encapsulation comprising a first barrier layer formed over the second electrode and having a first barrier layer edge, a further layer formed over the first barrier layer and having a further layer edge, and a second barrier layer formed over the further layer and having a second barrier layer edge;
   wherein the first and second barrier layers are inorganic and the further layer is a polymer,
   wherein the thin-film encapsulation comprises an edge region between the edge of the first barrier layer and the edge of the second barrier layer and within which the further layer edge of the further layer is present,
   wherein the voltage-light conversation device further comprises a structured electrically conducting layer on the substrate, at least one of the first and second electrodes being formed by or electrically connected to the structured conducting layer where at least part of the electrically conducting layer is not covered by the thin-film encapsulation,
   wherein the structured electrically conducting layer is structured by a groove comprising a structure edge in the edge region of the thin-film encapsulation, and
   wherein in the edge region at least a part of the structure edge of the groove of the structured electrically conducting layer is not perpendicular to the layer edge of the further layer;
   wherein the thin-film encapsulation follows the contours of the groove,
   wherein the thin-film encapsulation reaches to the structured electrically conducting layer in the edge region; and
   wherein the first barrier layer of the thin-film encapsulation directly contacts the substrate within the groove.

2. The voltage-light conversion device as defined in claim 1, wherein the structure edge of the groove is a meander-type.

3. The voltage-light conversion device as defined in claim 1, wherein in the edge region the structure edge of the groove comprises a first part being not perpendicular to layer edge and an adjacent second part enclosing an angle with the first part within a range of 45 to 135 degrees.

4. The voltage-light conversion device as defined in claim 1, wherein the voltage-light conversion material includes organic voltage-light conversion material.

5. The voltage-light conversion device as defined in claim 1, wherein the structured electrically conducting layer is the first electrode or electrically connected to the first electrode.

6. The voltage-light conversion device as defined in claim 1, wherein the width of the groove varies along the run of the groove.

7. The voltage-light conversion device as defined in claim 6, wherein the groove comprises wider portions having a larger width and narrower portions having a smaller width, wherein a sequence of narrower portions is arranged between two wider portions and wherein the structure edge is a meander-type edge formed by the narrower portions.

8. The voltage-light conversion device as defined in claim 1, wherein the electrically conducting layer is an ITO layer.

9. A voltage-light conversion device comprising:
   a first electrode on top of a substrate,
   a second electrode,
   a voltage-light conversion material adapted to perform a voltage-light conversion and arranged between the first electrode and the second electrode,
   a thin-film encapsulation for encapsulating at least the voltage-light conversion material, the encapsulation comprising a first barrier layer formed over the second electrode and having a first barrier layer edge, a further layer formed over the first barrier layer and having a further layer edge, and a second barrier layer formed over the further layer and having a second barrier layer edge;
   wherein the first and second barrier layers are inorganic and the further layer is a polymer,
   wherein the thin-film encapsulation comprises an edge region between the edge of the first barrier layer and the edge of the second barrier layer and within which the further layer edge of the further layer is present,
   wherein the voltage-light conversation device further comprises a structured electrically conducting layer on the substrate, at least one of the first and second electrodes being formed by or electrically connected to the structured conducting layer where at least part of the electrically conducting layer is not covered by the thin-film encapsulation,
   wherein the structured electrically conducting layer is structured by a groove comprising a structure edge in the edge region of the thin-film encapsulation, and
   wherein in the edge region at least a part of the structure edge of the groove of the structured electrically conducting layer is not perpendicular to the layer edge of the further layer; and
   wherein the thin-film encapsulation follows the contours of the groove.

10. The voltage-light conversion device as defined in claim 1, wherein the thin-film encapsulation reaches to the structured electrically conducting layer in the edge region.

* * * * *